United States Patent [19]

Kobayashi et al.

[11] Patent Number: 5,024,182

[45] Date of Patent: Jun. 18, 1991

[54] THIN FILM FORMING APPARATUS HAVING A GAS FLOW SETTLING DEVICE

[75] Inventors: Toshiyuki Kobayashi; Masao Koshinaka; Yoshimi Kinoshita; Masao Oda; Kenji Yoshizawa, all of Amagasaki, Japan

[73] Assignee: Mitsubishi Denki Kabushiki Kaisha, Japan

[21] Appl. No.: 376,015

[22] Filed: Jul. 6, 1989

[30] Foreign Application Priority Data

Jul. 15, 1988 [JP] Japan .................. 63-175231

[51] Int. Cl.$^5$ .................................... C23C 16/50
[52] U.S. Cl. ....................... 118/723; 118/715; 118/725; 118/729; 427/39; 427/45.1; 427/255.2; 427/255.5
[58] Field of Search .............. 118/715, 723, 725, 729; 156/345, 646; 219/10.55 A, 10.55 F; 315/111.21; 427/39, 45.1, 255.2, 255.5

[56] References Cited

U.S. PATENT DOCUMENTS

| | | | |
|---|---|---|---|
| 4,401,054 | 8/1983 | Matsuo | 118/723 |
| 4,805,555 | 2/1989 | Itoh | 118/719 |

FOREIGN PATENT DOCUMENTS

| | | | |
|---|---|---|---|
| 55-71027 | 5/1980 | Japan | 118/723 |
| 58-90731 | 5/1983 | Japan | 118/723 |
| 58-27656 | 6/1983 | Japan | . |
| 61-26777 | 2/1986 | Japan | 118/723 |
| 61-166975 | 7/1986 | Japan | 427/45.1 |
| 61-272386 | 12/1986 | Japan | 118/723 |
| 62-40382 | 2/1987 | Japan | 118/723 |
| 62-40386 | 2/1987 | Japan | 118/723 |
| 62-44578 | 2/1987 | Japan | 118/723 |
| 62-142783 | 6/1987 | Japan | 118/723 |
| 62-213126 | 9/1987 | Japan | . |
| 62-266820 | 11/1987 | Japan | 118/723 |
| 62-294181 | 12/1987 | Japan | 427/45.1 |
| 63-7374 | 1/1988 | Japan | 427/45.1 |

Primary Examiner—Norman Morgenstern
Assistant Examiner—Terry J. Owens
Attorney, Agent, or Firm—Leydig, Voit & Mayer

[57] ABSTRACT

An apparatus for forming a thin film on a substrate by bringing a first gas and a second gas into reaction with each other in a reaction chamber near the surface of the substrate in the reaction chamber. The apparatus has a plasma generating chamber disposed adjacent to the reaction chamber for generating a plasma of the first gas in a predetermined direction. A first gas inlet is provided at the boundary between the plasma generating chamber and the reaction chamber and formed to extend in the predetermined direction, while a second gas inlet is provided in the vicinity of the first gas inlet and extended in the predetermined direction. The apparatus further has a first gas supplying device for introducing the first gas into the plasma generating chamber and for introducing the first gas activated by a plasma in the plasma generating chamber into the reaction chamber through the first gas inlet, and second gas supplying device for supplying the second gas into the reaction chamber through the second gas inlet. A first flow settling device having plates disposed transverse to the flow of the first gas is positioned between the first gas inlet and plasma chamber. A second flow settling device may be located between the second gas supplying device and second gas inlet.

11 Claims, 3 Drawing Sheets

THIN FILM FORMING APPARATUS HAVING A GAS FLOW SETTLING DEVICE

BACKGROUND OF THE INVENTION

1. Field of the Invention

The present invention relates to an apparatus for forming a thin film and, more particularly, to an apparatus which is suitable for use in forming a thin film on a substrate in a semiconductor production system.

2. Description of the Related Art

FIG. 3 shows a known thin-film forming apparatus of vapor chemical reaction type relying upon a plasma excitation. This apparatus has a reaction chamber 3 and a heating plate 2 disposed at the center of the reaction chamber 3. The apparatus also has a material gas supplying section 4 and an activated gas supplying section 7 disposed on one side of the reaction chamber 3. The material gas supplying section 4 is capable of supplying into the reaction chamber 3 a material gas $G_1$ containing components of the thin film to be formed on the surface of a substrate 1. For instance, when a thin film of a silicon compound is to be formed, a silane gas is used as the material gas $G_1$. On the other hand, the activated gas supplying section 7 is adapted for supplying into the reaction chamber 3 a reaction gas $G_2$ such as $N_2$, $O_2$ or the like activated by a plasma. A plasma generating section 5 is connected to the activated gas supplying section 7 through an activated gas introduction pipe 6. An evacuating section 8 is connected to the reaction chamber 3.

The operation of this apparatus will be described on an assumption that a nitride film is to be formed as the thin film. Substrates 1 are placed on a heating plate 2. The heating plate 2 is supplied with power to generate heat, thereby heating the substrates 1 up to, for example, 300° C. Meanwhile, $N_2$ gas is supplied to the plasma generating section 5, as the reaction gas $G_2$. The reaction gas $G_2$ is activated by the plasma, and then supplied into the reaction chamber 3 through the activated gas introduction pipe 6 and the activated gas supplying section 7. At the same time, silane gas as the material gas $G_1$ is supplied into the reaction chamber 3 through the material gas supplying section 4. In the reaction chamber 3, the material gas $G_1$ and the reaction gas $G_2$ react to form a thin film of silicon nitride on the surface of the substrate 1. The gases in the reaction chamber 3 are discharged through the evacuating section 8 so that a substantially constant pressure of, for example, 0.1 Torr is maintained in the reaction chamber 3.

This known apparatus, however, suffers from the following problems.

Namely, since the reaction gas $G_2$ activated by the plasma in the plasma generating section 5 flows a long distance to the reaction chamber 3 through the activated gas introduction pipe 6, the activity possessed by the reaction gas $G_2$ is seriously wasted during flowing of the gas. In addition, it has been difficult to uniformly supply the reaction chamber 3 with the reaction gas $G_2$ which has been introduced from the plasma generating section 5 through the activated gas introduction pipe 6 and which enters the reaction chamber 3 through the activated gas supplying section 7. For these reasons, the known apparatus could not cope well cope with a demand for quick formation of a uniform thin film over a wide area.

SUMMARY OF THE INVENTION

Accordingly, an object of the present invention is to provide a thin-film forming apparatus which is capable of quickly forming a uniform thin film over a wide area, thereby overcoming the above-described problems of the prior art.

To this end, according to the present invention, there is provided an apparatus for forming a thin film on a substrate by bringing a first gas and a second gas into reaction with each other, the apparatus comprising: a vessel defining a reaction chamber therein; substrate holding means for holding the substrate in the reaction chamber; plasma generating means disposed adjacent to the reaction chamber for generating a plasma of the first gas elongated in a predetermined direction; first gas inlet means provided at the boundary between the plasma generating means and the reaction chamber and formed to extend in the predetermined direction; second gas inlet means provided in the vicinity of the first gas inlet means and extending in the predetermined direction; first gas supplying means for introducing the first gas into the plasma generating means and for introducing the first gas activated by a plasma in the plasma generating means into the reaction chamber through the first gas inlet means; and second gas supplying means for supplying the second gas into the reaction chamber through the second gas inlet means.

DESCRIPTION OF THE PREFERRED EMBODIMENTS

A preferred embodiment of the present invention will be described hereinunder with reference to the accompanying drawings.

Figure 1:
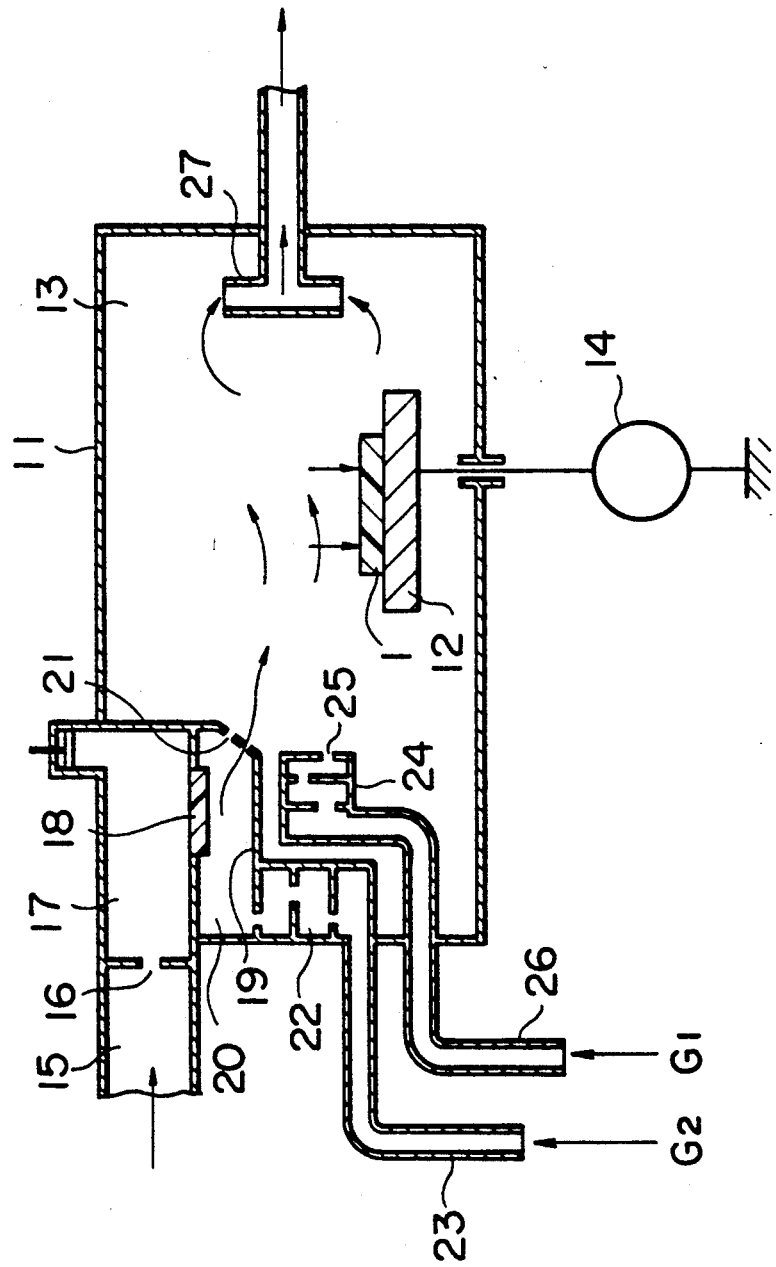
FIG. 1 is a sectional view of an embodiment of a thin-film forming apparatus in accordance with the present invention.

Referring to FIG. 1, a vessel 11 defines a reaction chamber 13 in the lower central portion of which is disposed a substrate holder 12. The substrate holder 12 supports a substrate 1 which is to be processed. The substrate holder 12 incorporates a heating mechanism (not shown) so that it can heat the substrate 1 up to a predetermined temperature. A D.C. bias power supply 14 installed externally of the reaction chamber 13 is connected to the substrate holder 12 to hold the substrate 1 at a predetermined electrical potential.

Figure 2:
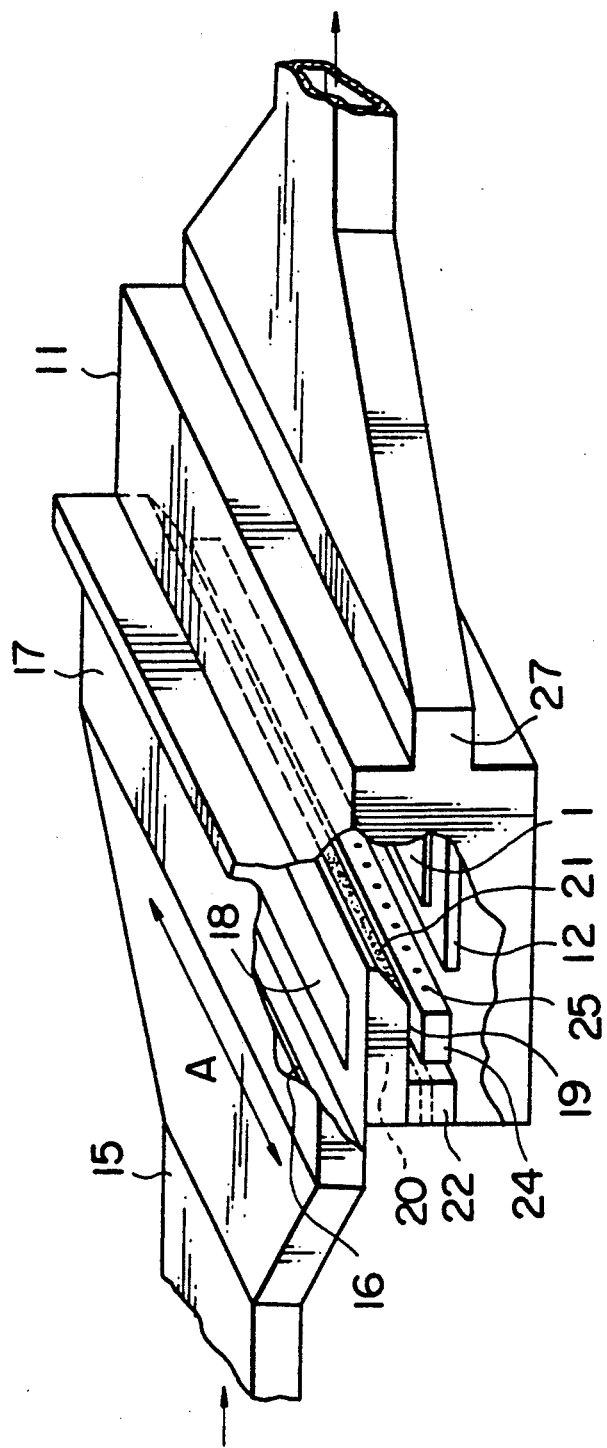
FIG. 2 is a fragmentary perspective view of the apparatus shown in FIG. 1.
Figure 3:
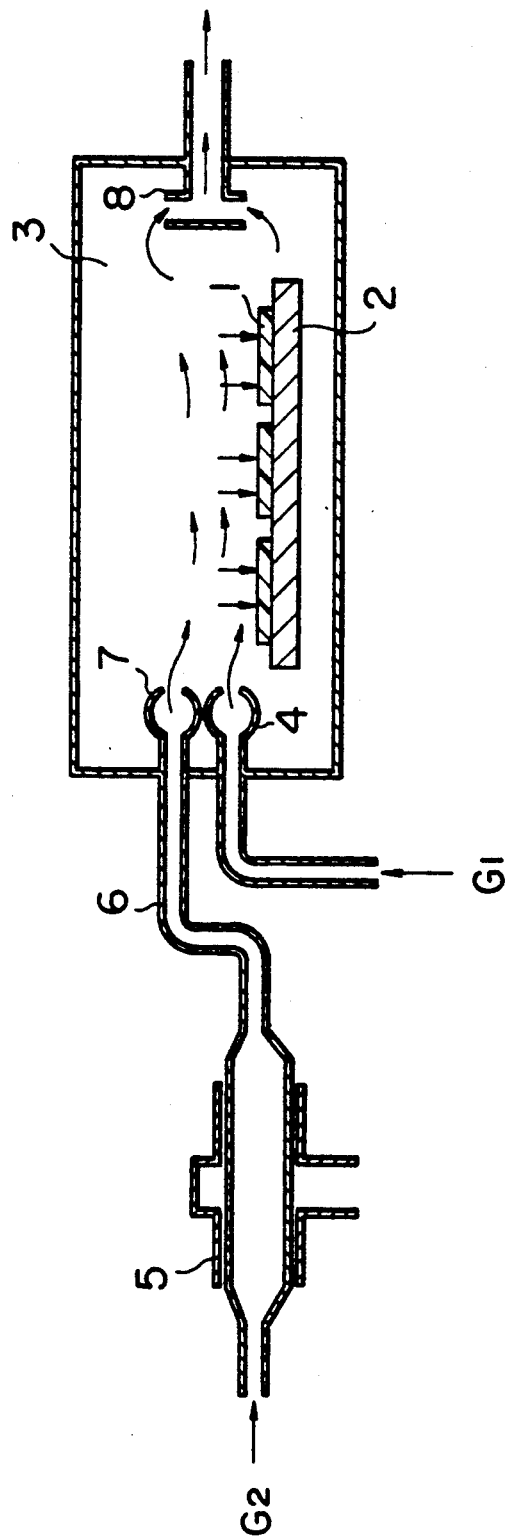
FIG. 3 is a sectional view of a known thin-film forming apparatus.

A micro-wave waveguide tube 15 is connected to an upper portion of the vessel 11. As will be seen from FIG. 2, the waveguide 15 has an output end which linearly extends within a horizontal plane as indicated by a double-headed arrow A. The extending output end of the waveguide 15 is coupled to a resonator 17 through a coupler 16. The resonator 17 has a breadth corresponding to that of the output end of the waveguide 15, thus spreading in the directions of the arrow A. The coupler 16 enables microwave coupling between the waveguide 15 and the resonator 17. It is possible to attain a uniform distribution of an electromagnetic field within the resonator 17 in the directions of the arrow A, by adjusting the distribution of apertures in the coupler 16 in the directions of the arrow A.

An elongated partition member 18 extending in the directions of the arrow A is provided on the bottom of the resonator 17. The partition member 18 is a transmission window for a microwaves. The partition member 18 is formed of a dielectric material. A wall portion 19 is formed under the resonator 17 opposing the partition member 18. An elongated plasma generating chamber 20 is formed between the wall portion 19 and the resonator 17 extending in the directions of the arrow A. The wall portion 19 is made of a material having a higher conductivity than a plasma. A reaction gas inlet 21 in the form of a gauze is disposed in the wall portion 19 extending in the directions of the arrow A and facing obliquely downward. A slit is formed in the wall portion 19 extending in the directions of the arrow A. A reaction gas flow settling section 22 is connected to the plasma generating chamber 20 through the slit. The reaction gas flow settling section 22 has an elongated form which extends in the directions of the arrow A as is the case of the plasma generating chamber 20. A reaction gas supply pipe 23 is connected to the reaction gas flow settling section 22.

An elongated gas flow settling section 24 extends in the directions of the arrow A and is disposed under the wall portion 19. A gas inlet 25 in the form of a horizontal row of a multiplicity of circular ports or a continuous elongated slit extending in the directions of the arrow A is formed in the wall of the gas flow settling section 24. A gas supply pipe 26 is connected to the gas flow settling section 24. Furthermore, an evacuation section 27 for discharging gases from the reaction chamber 13 is disposed in the reaction chamber 13.

A microwave generating device (not shown) is connected to the waveguide 15. A reaction gas supplying device and a material gas supplying device, both being omitted from the drawings, are connected to the reaction gas supply pipe 23 and the gas supply pipe 26, respectively.

A description will be given hereinafter of a method for forming a thin film with the illustrated embodiment of the apparatus.

The substrate 1 is placed on the substrate holder 12 and is then heated to a predetermined temperature by the unillustrated heating device incorporated in the substrate holder 12. Subsequently, microwave energy generated in the unillustrated microwave generating device is guided into the resonator 17 through the wave-guide 15. It is assumed that the coupler 16 has been adjusted beforehand to provide a uniform distribution of the electromagnetic field in the directions of the arrow A within the resonator 17. In this state, the microwave energy having an electric field perpendicular to the partition member 18 on the bottom of the resonator 17 is transmitted through the partition member 18, thus entering the plasma generating chamber 20 from the resonator 17.

A reaction gas $G_2$ is supplied into the flow settling section 22 from the unillustrated reaction gas supplying device through the pipe 23. The reaction gas $G_2$ is uniformly spread in the directions of the arrow A through the flow settling section 22 and is introduced into the plasma generating chamber 20 through the slit formed in the wall portion 19. The reaction gas $G_2$ introduced into the plasma generating chamber 20 is changed into a plasma by the microwave energy has been transmitted through the partition member 18, whereby an elongated plasma extending in the directions of the arrow A is formed in the plasma generating chamber 20. The reaction gas $G_2$ continuously supplied into the plasma generating chamber 20 past the flow settling section 22 is activated by the plasma and is then introduced into the reaction chamber 13 through the reaction gas inlet 21. The microwave energy which has reached the plasma generating chamber 20 through the partition member 18 from the resonator 17 cannot be transmitted through the reaction gas inlet 21 formed in the wall portion 19 which is made of a conductive material and, therefore, cannot reach the interior of the reaction chamber 13.

The gas $G_1$ is introduced into the flow settling section 24 from the unillustrated material gas supplying device through the pipe 26. The gas $G_1$ is uniformly spread in the directions of the arrow A in the flow settling section 24 and is supplied into the reaction chamber 13 through the gas inlet 25.

The reaction gas $G_2$ and the gas $G_1$ thus introduced into the reaction chamber 13 react with each other in the region near the surface of the semiconductor substrate 1 which has been heated to a predetermined temperature, so that a thin film is formed on the surface of the substrate 1.

The gases in the reaction chamber 13 are discharged to the outside through the evacuating section 27 so that the pressure in the reaction chamber is maintained at a level of, for example, 0.1 Torr.

The gas $G_1$ and the reaction gas $G_2$ are selected in accordance with the type of the thin film to be formed. For instance, when a silicon nitride film is to be formed, silane and $N_2$ are used, respectively, as the gas $G_1$ and the reaction gas $G_2$.

As will be understood from the foregoing description, the reaction gas $G_2$ activated by the plasma is required to travel only a short distance to the region near the substrate to be processed, so that the reaction gas $G_2$ experiences an extremely small loss of activity. In addition, since the reaction gas $G_2$ is uniformly spread in the directions of the arrow A before supplied to the substrate to be processed, it is possible to quickly and uniformly form a thin film over a wide area.

The reaction products generated as a result of the reaction between the gas $G_1$ and the reaction gas $G_2$ collide with each other in the gaseous phase maintained in the reaction chamber 13. If the substrate 1 is biased to a negative potential by the D.C. bias power supply 14, the positively charged particles are extracted from the plasma generating chamber 20 and they are accelerated to strongly collide with the substrate 1 by the effect of an electric field formed around the substrate 1. It is thus possible to form a thin film having a fine structure and strong adhesion to the surface of the substrate 1.

Although not shown, a driving device which comprises, for example, a driving motor may be incorporated for the purpose of driving the substrate holder 12 in the directions of the arrow A. Such a driving device enables the substrate 1 to be moved together with the substrate holder 12 during formation of the film, thus improving the efficiency of film formation over a wide area.

What is claimed is:

1. An apparatus for forming a thin film on a substrate by reacting first and second gases comprising:
a vessel enclosing a reaction chamber;
substrate holding means for holding a substrate in said reaction chamber;
plasma generating means including a waveguide for transmitting microwave energy toward said reaction chamber, said waveguide including two substantially planar, generally parallel, electrically conducting walls that are elongated in a first direction transverse to the direction of propagation of microwaves in said waveguide, and an elongated dielectric window generally parallel to and extending in one of said walls in the first direction for transmitting microwave energy from the waveguide to a first gas inlet means;

first gas inlet means disposed between said plasma generating means and said reaction chamber including a plasma chamber extending in the first direction for receiving microwave energy transmitted through the dielectric window to establish and maintain a plasma in the first gas in said plasma chamber, a first gas inlet for supplying the first gas to said plasma chamber, first flow settling means disposed between said first gas inlet and said plasma chamber for settling flow of the first gas into the plasma chamber including plates disposed transverse to the flow of the first gas for establishing a tortuous flow path for the first gas, and including an elongated opening extending in the first direction for flow of the first gas from said plasma chamber into said reaction chamber; and second gas inlet means including an outlet extending in the first direction in communication with said reaction chamber for supplying the second gas to said reaction chamber, said outlet being disposed proximate the opening of said first gas inlet means.

2. The apparatus of claim 1 wherein said plasma generating means includes:

a microwave resonator disposed in said waveguide and extending in the first direction 3. The apparatus according to claim 1, comprising evacuation means for evacuating gases from said reaction chamber.

4. The apparatus according to claim 1 wherein said second gas inlet means comprises a second gas inlet for admitting the second gas and second flow settling means disposed between said second gas inlet and said outlet for settling the flow of the second gas into said reaction chamber.

5. The apparatus according to claim 1, comprising heating means for heating substrate held by said substrate holding means.

6. The apparatus according to claim 1, comprising driving means within said reaction chamber for moving said substrate holding means.

7. The apparatus according to claim 6 wherein said driving means includes means for moving said substrate holding means in said first direction.

8. The apparatus according to claim 1, comprising power supply means for charging a substrate on said substrate holding means to a preselected electrical potential level.

9. The apparatus according to claim 1 wherein said outlet comprises a plurality of uniformly spaced holes extending in the first direction.

10. The apparatus according to claim 1 including gauze disposed in the opening in said first gas inlet means between said plasma chamber and said reaction chamber.

11. The apparatus according to claim 4 wherein said second flow settling means comprises plates disposed transverse to the flow of the second gas for establishing a tortuous flow path for the second gas.

* * * * *